(12) United States Patent
Zhu et al.

(10) Patent No.: US 11,437,593 B2
(45) Date of Patent: Sep. 6, 2022

(54) FLEXIBLE DISPLAY PANEL, METHOD FOR FABRICATING THE SAME, AND DISPLAY DEVICE

(71) Applicant: BOE Technology Group Co., Ltd., Beijing (CN)

(72) Inventors: Xiaoyan Zhu, Beijing (CN); Changhan Hsieh, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 435 days.

(21) Appl. No.: 16/497,509

(22) PCT Filed: Mar. 27, 2019

(86) PCT No.: PCT/CN2019/079959
§ 371 (c)(1),
(2) Date: Sep. 25, 2019

(87) PCT Pub. No.: WO2019/196657
PCT Pub. Date: Oct. 17, 2019

(65) Prior Publication Data
US 2021/0408402 A1    Dec. 30, 2021

(30) Foreign Application Priority Data

Apr. 12, 2018    (CN) .......................... 201810325012.X

(51) Int. Cl.
*H01L 51/00*    (2006.01)
*B32B 7/022*    (2019.01)
(Continued)

(52) U.S. Cl.
CPC .......... *H01L 51/0097* (2013.01); *B32B 7/022* (2019.01); *B32B 27/08* (2013.01);
(Continued)

(58) Field of Classification Search
None
See application file for complete search history.

(56) References Cited

U.S. PATENT DOCUMENTS

| | | | |
|---|---|---|---|
| 10,983,562 B2 * | 4/2021 | Cho ...................... G06F 1/1616 |
| 2009/0201443 A1 | 8/2009 | Sasaki et al. | |

(Continued)

FOREIGN PATENT DOCUMENTS

| | | |
|---|---|---|
| CN | 102113089 A | 6/2011 |
| CN | 105845700 A | 8/2016 |

(Continued)

OTHER PUBLICATIONS

Office Action for corresponding Chinese Application No. 201810325012.X dated Apr. 16, 2019.

(Continued)

*Primary Examiner* — J. E. Schoenholtz
(74) *Attorney, Agent, or Firm* — ArentFox Schiff LLP; Michael Fainberg

(57) ABSTRACT

A flexible display panel includes: a flexible substrate, a thin film transistor layer, a light-emitting layer, an encapsulation layer located on one side of the flexible substrate successively, the flexible display panel includes a bending area where a neutral layer adjusting layer is located on the side of the flexible substrate away from the light-emitting layer; when the bending area is a first bending area, the neutral layer adjusting layer adjusts position of neutral layer in the first bending area to the encapsulation layer; when the bending area is a second bending area, the neutral layer adjusting layer adjusts position of neutral layer in the second bending area to the thin film transistor layer; the first bending area is an area where the flexible substrate is bent (Continued)

away from the light-emitting layer, and the second bending area is an area where the flexible substrate is bent toward the light-emitting layer.

14 Claims, 3 Drawing Sheets

(51) Int. Cl.
    *B32B 27/08*     (2006.01)
    *B32B 27/28*     (2006.01)
    *B32B 37/18*     (2006.01)
    *B32B 38/00*     (2006.01)
    *H01L 27/32*     (2006.01)
    *H01L 51/52*     (2006.01)
    *H01L 51/56*     (2006.01)

(52) U.S. Cl.
    CPC .......... *B32B 27/281* (2013.01); *B32B 27/283* (2013.01); *B32B 37/182* (2013.01); *B32B 38/0004* (2013.01); *B32B 38/0008* (2013.01); *H01L 27/3244* (2013.01); *H01L 51/5253* (2013.01); *H01L 51/56* (2013.01); *B32B 2305/72* (2013.01); *B32B 2307/54* (2013.01); *B32B 2307/546* (2013.01); *B32B 2310/0831* (2013.01); *B32B 2379/08* (2013.01); *B32B 2383/00* (2013.01); *B32B 2457/20* (2013.01); *H01L 2251/5338* (2013.01)

(56) References Cited

U.S. PATENT DOCUMENTS

| | | |
|---|---|---|
| 2010/0002402 A1 | 1/2010 | Rogers et al. |
| 2015/0310776 A1 | 10/2015 | Lee et al. |
| 2016/0143130 A1 | 5/2016 | Wu et al. |
| 2017/0155087 A1 | 6/2017 | Lee et al. |
| 2017/0371194 A1 | 12/2017 | Tomioka |
| 2021/0119155 A1* | 4/2021 | Huang ................ H01L 51/5253 |

FOREIGN PATENT DOCUMENTS

| | | |
|---|---|---|
| CN | 106876410 A | 6/2017 |
| CN | 107025850 A | 8/2017 |
| CN | 206864470 U | 1/2018 |
| CN | 108470853 A | 8/2018 |

OTHER PUBLICATIONS

Office Action for corresponding Chinese Application No. 201810325012.X dated Sep. 19, 2019.

* cited by examiner

FLEXIBLE DISPLAY PANEL, METHOD FOR FABRICATING THE SAME, AND DISPLAY DEVICE

This application is claims a US National Stage of International Application No. PCT/CN2019/079959, filed Mar. 27, 2019, designating the United States, and claiming the benefits of Chinese Patent Application No. 201810325012.X, filed with the Chinese Patent Office on Apr. 12, 2018, and entitled "A flexible display panel, a method for fabricating the same, and a display device", which is hereby incorporated by reference in its entirety.

FIELD

This disclosure relates to the field of display technologies, and particularly to a flexible display panel, a method for fabricating the same, and a display device.

BACKGROUND

As the display technologies are advancing rapidly, flexible display panels which can be folded have been a focus in the field of researches and developments of display panels. When a flexible display panel is a multi-foldable product, both a thin film transistor layer and an encapsulation layer of the flexible display panel shall be bent under a rigorous condition.

SUMMARY

In a first aspect, an embodiment of this disclosure provides a flexible display panel including: a flexible substrate, and a thin film transistor layer, a light-emitting layer, and an encapsulation layer located on one side of the flexible substrate successively, wherein:

the flexible display panel includes a bending area in which a neutral layer adjusting layer is located on the side of the flexible substrate away from the light-emitting layer;

when the bending area is a first bending area, the neutral layer adjusting layer is configured to adjust the position of a neutral layer in the first bending area to the encapsulation layer; and when the bending area is a second bending area, the neutral layer adjusting layer is configured to adjust the position of the neutral layer in the second bending area to the thin film transistor layer;

wherein the first bending area is an area where the flexible substrate is bent away from the light-emitting layer, and the second bending area is an area where the flexible substrate is bent toward the light-emitting layer.

Optionally in the flexible display panel according to the embodiment of the invention, the flexible display panel includes the first bending area and the second bending area; and the neutral layer adjusting layer corresponding to the first bending area is a first neutral layer adjusting layer, and the neutral layer adjusting layer corresponding to the second bending area is a second neutral layer adjusting layer.

Optionally in the flexible display panel according to the embodiment of the invention, a first Young's modulus of the first neutral layer adjusting layer is smaller than a second Young's modulus of the second neutral layer adjusting layer.

Optionally in the flexible display panel according to the embodiment of the invention, a first thickness of the first neutral layer adjusting layer is smaller than a second thickness of the second neutral layer adjusting layer.

Optionally in the flexible display panel according to the embodiment of the invention, the first neutral layer adjusting layer is arranged at the same layer as the second neutral layer adjusting layer.

Optionally in the flexible display panel according to the embodiment of the invention, the material of the flexible substrate includes Polyimide; and the material of the neutral layer adjusting layer includes Polydimethylsiloxane.

In a second aspect, an embodiment of this disclosure further provides a display device including the flexible display panel according to any one of the embodiments in the first aspect.

In a third aspect, an embodiment of this disclosure further provides a method for fabricating the flexible display panel according to any one of the embodiments in the first aspect, the method including:

fabricating the flexible display panel; and forming the neutral layer adjusting layer in the bending area of the flexible display panel.

Optionally in the method for fabricating the flexible display panel according to the embodiment of this disclosure, when the flexible display panel includes the first bending area and the second bending area, the method includes:

forming the first neutral layer adjusting layer at a corresponding position to the first bending area, on the flexible display panel; and forming the second neutral layer adjusting layer at a corresponding position to the second bending area, on the flexible display panel.

Optionally in the method for fabricating the flexible display panel according to the embodiment of this disclosure, the first neutral layer adjusting layer and the second neutral layer adjusting layer are formed at the same layer.

Optionally in the method for fabricating the flexible display panel according to the embodiment of this disclosure, forming the neutral layer adjusting layer in the bending area of the flexible display panel includes:

fitting a back film on the surface of the flexible substrate of the flexible display panel on the side thereof away from the light-emitting layer; and optically curing the back film using a mask to change a Young's modulus of the back film so that the position of the neutral layer of the flexible display panel, at the corresponding position to the second bending area is adjusted to the thin film transistor layer, and the position of the neutral layer of the flexible display panel, at the corresponding position to the first bending area is adjusted to the encapsulation layer.

Optionally in the method for fabricating the flexible display panel according to the embodiment of this disclosure, the back film is optically cured using the mask by optically curing the back film through ultraviolet irradiation.

Optionally in the method for fabricating the flexible display panel according to the embodiment of this disclosure, forming the neutral layer adjusting layer in the bending area of the flexible display panel includes:

fitting a back film on the surface of the flexible substrate of the flexible display panel on the side thereof away from the light-emitting layer; and cutting the back film to thereby adjust the thickness thereof so that the position of the neutral layer of the flexible display panel, at the corresponding position to the second bending area is adjusted to the thin film transistor, and the position of the neutral layer of the flexible display panel, at the corresponding position to the first bending area is adjusted to the encapsulation layer.

DETAILED DESCRIPTION OF THE EMBODIMENTS

The technical solutions according to the embodiments of this disclosure will be described below clearly and fully with reference to the drawings in the embodiments of this disclosure, and apparently the embodiments described here are only a part but not all of the embodiments of this disclosure. Based upon the embodiments here of this disclosure. All the other embodiments which can occur to those ordinarily skilled in the art without any inventive effort shall fall into the claimed scope of this disclosure.

In the flexible display panel, the method for fabricating the same, and the display device according to the embodiments of this disclosure, the display device includes the flexible display panel; and a neutral layer adjusting layer is arranged in the flexible display panel to alleviate a stress applied to a thin film transistor layer and an encapsulation layer while the flexible display panel is being bent, so as to alleviate the thin film transistor layer and the encapsulation layer from being strained after the stress is applied thereto while the flexible display panel is being bent, thus avoiding such a phenomenon that the thin film transistor layer and the encapsulation layer of the flexible display panel may be damaged because only one of the pulling and pressing stresses can be born.

Figure 1:
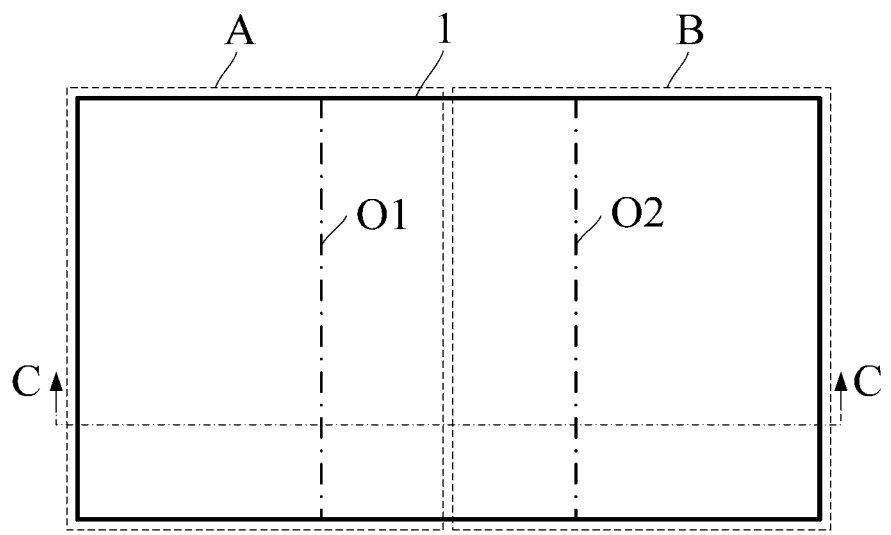
FIG. 1 is a schematic structural diagram of a flexible display panel according to an embodiment of the invention as a whole.
Figure 2:
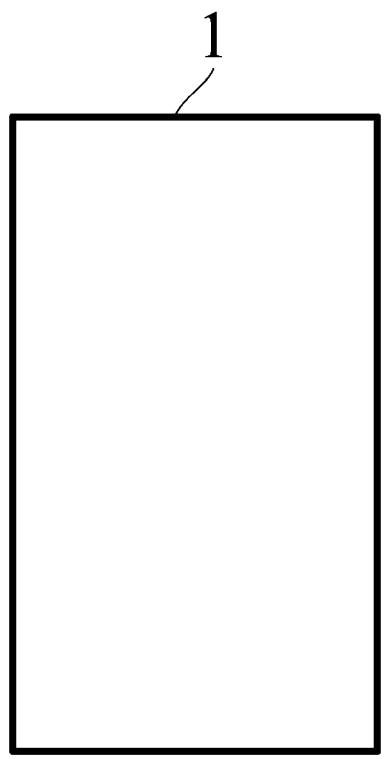
FIG. 2 is a schematic structural diagram of the flexible display panel in FIG. 1 as a whole after it is folded.
Figure 3:
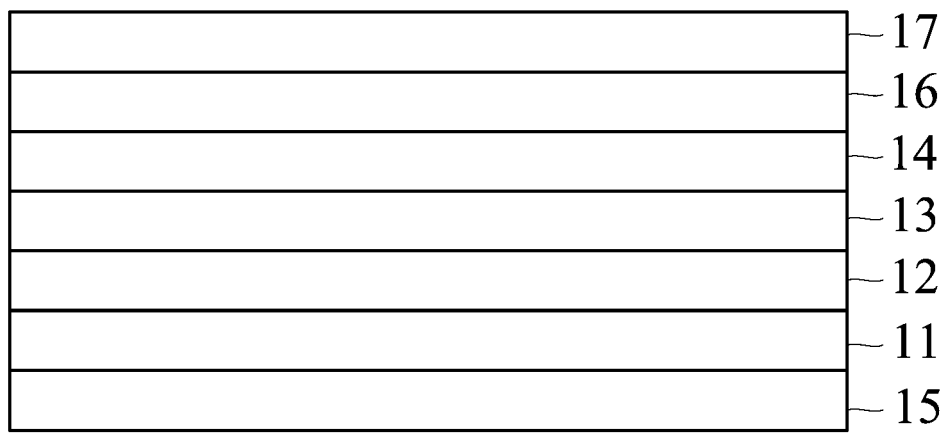
FIG. 3 is a schematic structural diagram of the flexible display panel in FIG. 1 in a sectional view along C-C.

Optionally referring to FIG. 1, FIG. 2, and FIG. 3, a flexible display panel 1 according to an embodiment of this disclosure includes a flexible substrate 11, and a thin film transistor layer 12, a light-emitting layer 13, and an encapsulation layer 14 located on one side of the flexible substrate 11 successively.

Figure 4:
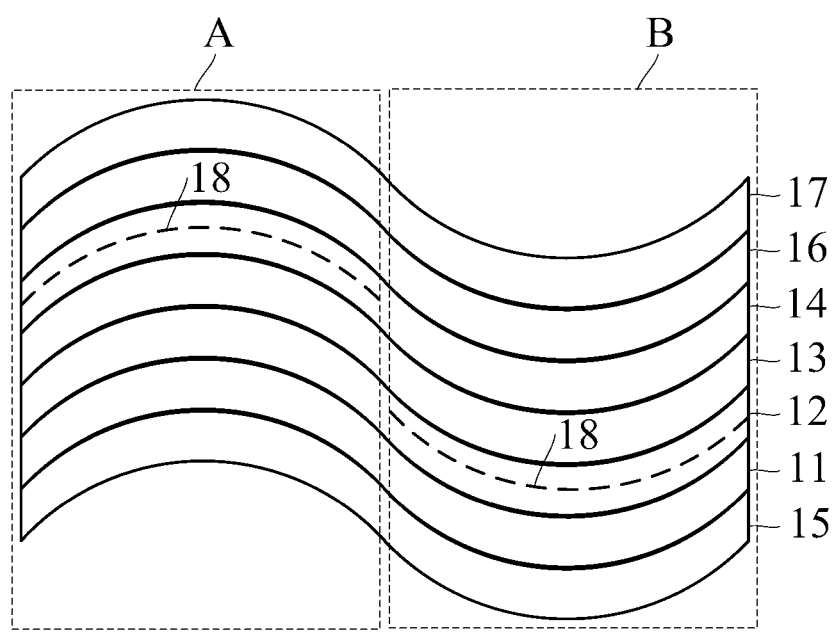
FIG. 4 is a schematic structural diagram of the flexible display panel in FIG. 3 when it is bent.

The flexible display panel 1 includes a bending area in which a neutral layer adjusting layer 15 is located on the side of the flexible substrate 11 away from the light-emitting layer 13;

As illustrated in FIG. 4, when the bending area is a first bending area A, the neutral layer adjusting layer 15 is configured to adjust the position of a neutral layer 18 in the first bending area A to the encapsulation layer 14.

When the bending area is a second bending area B, the neutral layer adjusting layer 15 is configured to adjust the position of the neutral layer 18 in the second bending area B to the thin film transistor layer 12.

Where the first bending area A is an area where the flexible substrate 11 can be bent away from the light-emitting layer 13, and the second bending area B is an area where the flexible substrate 11 can be bent toward the light-emitting layer 13.

The flexible display panel 1 as structured in FIG. 3 includes a flexible substrate 11, and a thin film transistor 12, a light-emitting layer 13, and an encapsulation layer 14 formed on the flexible substrate 11 successively, and can further include a polarizing sheet layer 16 and a protecting layer 17 formed above the encapsulation layer 14, and a back film is arranged on the side of the flexible substrate 11 away from the thin film transistor layer 12 to form a neutral layer adjusting layer 15.

The flexible display panel 1 as structured in FIG. 1 includes a first bending area A and a second bending area B, which are areas surrounded in dotted boxes as illustrated in FIG. 1, FIG. 4, FIG. 5, and FIG. 6 respectively, and in a real production process, the particular number of bending areas in the flexible display panel 1, and their particular positions can be set as needed in reality, and the flexible display panel 1 will not be limited to the structure as illustrated in FIG. 1 in which there are only two bending areas including the first bending area A and the second bending area B; and for example, the flexible display panel 1 can be only arranged with one first bending area A or one second bending area B, or can be arranged with one first bending area A and two second bending areas B, or can be arranged with two first bending areas A and one second bending area B, and when the flexible display panel 1 is to be fabricated in a multi-foldable structure, a plurality of first bending areas A and a plurality of second bending areas B can be arranged, and their positions can be configured as needed in reality. FIG. 1 illustrates the flexible display panel 1 before it is bent, and FIG. 2 illustrates the folded flexible display panel 1 after it is bent.

Figure 5:
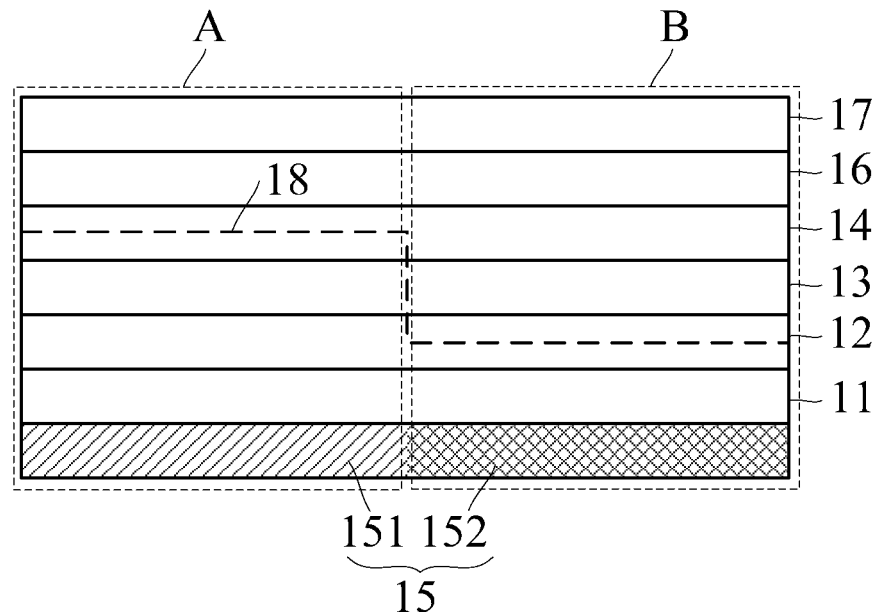
FIG. 5 is a schematic structural diagram of the flexible display panel in FIG. 3 at a neutral layer position.
Figure 6:
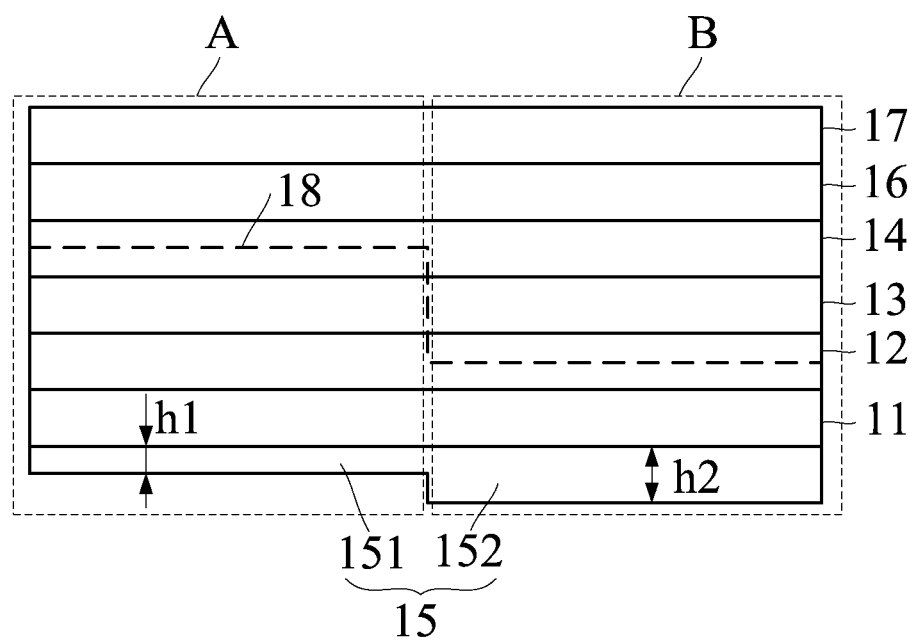
FIG. 6 is another schematic structural diagram of the flexible display panel in FIG. 1 in a sectional view along C-C.

Optionally in the flexible display panel according to the embodiment of this disclosure, as illustrated in FIG. 5 and FIG. 6, the flexible display panel can include the first bending area A and the second bending area B.

The neutral layer adjusting layer 15 corresponding to the first bending area A is a first neutral layer adjusting layer 151, and the neutral layer adjusting layer 154 corresponding to the second bending area B is a second neutral layer adjusting layer 152.

In the embodiment of this disclosure, the neutral layer 18 is a layer including all the positions where there is a zero stress while the flexible display panel 1 is being bent, where the layer is located at the neutral layer 18 as denoted by the dotted lines in the flexible display panel 1 in FIG. 4, FIG. 5, and FIG. 6. As illustrated in FIG. 1, the bending axis of the first bending area A is a first axis O1, and the bending axis of the second bending area B is a second axis O2, and as illustrated in FIG. 4, both the first axis O1 and the second axis O2 are perpendicular to the paper. FIG. 3 illustrates the shape of the flexible display panel 1 before it is bent, and FIG. 4 illustrates a particular structural diagram of the flexible display panel 1 while it is being bent. As illustrated in FIG. 4, the first bending area A is bent from the flexible substrate 11 away from the light-emitting layer 13, which is referred to as bending outward, and at this time, the entire area of the flexible display panel 1 below the neutral layer 18 is pressed, thus resulting in a pressing stress, and the entire area thereof above the neutral layer is pulled, thus resulting in a pulling stress; and the seconding area B is bent from the flexible substrate 11 toward the light-emitting layer 13, which is referred to bending inward, and at this time, the entire area of the flexible display panel 1 below the neutral layer 18 is pulled, thus resulting in a pulling stress, and the entire area thereof above the neutral layer is pressed, thus resulting in a pressing stress.

In the embodiment of this disclosure, the neutral layer 18 as described above is a layer including all the positions where there is a zero stress while the flexible display panel 1 is being bent; and the flexible display panel 1 is arranged with the neutral layer adjusting layer 15 configured to adjust the position of the neutral layer 18, and when the bending areas of the flexible display panel 1 are bent inward and outward, the neutral layer adjusting layer 15 can make the thin film transistor 12 and the encapsulation layer 14 in the bending areas located respectively at the neutral layer 18. As illustrated in FIG. 4, the neutral layer 18 is located at the encapsulation layer 14 in the first bending area A, and located at the thin film transistor layer 12 in the second bending area B, and both the encapsulation layer 14 and the thin film transistor layer 12 are pressed; and since both the encapsulation layer 14 and the thin film transistor layer 12 can bear the pressing stress but can not bear the pulling stress, the pulling stress applied to the thin film transistor layer 12 and the encapsulation layer 14 while the flexible display panel 1 is being bent can be alleviated to thereby alleviate the thin film transistor layer 12 and the encapsulation layer 14 from being strained after the stress is applied thereto while the flexible display panel 1 is being bent, so as to avoid such a phenomenon that the thin film transistor layer 12 and the encapsulation layer 14 of the flexible display panel 1 may be damaged because only one of the pulling and pressing stresses can be born.

Accordingly the flexible display panel 1 above can address the problem in the prior art that the thin film transistor layer 12 and the encapsulation layer 14 of the flexible display panel 1 can only bear only one of the pulling and pressing stresses.

The neutral layer adjusting layer 15 can adjust the positions of the neutral layer 18 in the bending areas of the flexible display panel 1 in the following two implementations.

In a first implementation, as illustrated in FIG. 5, a first Young's modulus of the first neutral layer adjusting layer 151 is smaller than a second Young's modulus of the second neutral layer adjusting layer 152.

Since the first Young's modulus of the first neutral layer adjusting layer 151 is smaller than the second Young's modulus of the second neutral layer adjusting layer 152, the first Young's modulus of the first neutral layer adjusting layer 151 is smaller so that the position of the neutral layer 18 in the first bending area A is moved upward, and the first Young's modulus is adjusted to thereby adjust the position of the neutral layer 18 to the encapsulation layer 14; and the second Young's modulus of the second neutral layer adjusting layer 152 is larger so that the position of the neutral layer 18 in the second bending area B is moved downward, and the second Young's modulus is adjusted to thereby adjust the position of the neutral layer 18 to the thin film transistor layer 12, so that both the thin film transistor layer 12 and the encapsulation layer 14 can be pressed while the flexible display panel 1 is being bent.

In a second implementation, as illustrated in FIG. 6, a first thickness h1 of the first neutral layer adjusting layer 151 is smaller than a second thickness h2 of the second neutral layer adjusting layer 152.

Since the first thickness of the first neutral layer adjusting layer 151 is smaller than the second thickness of the second neutral layer adjusting layer 152, the first thickness h1 of the first neutral layer adjusting layer 151 is smaller, and the second thickness h2 of the second neutral layer adjusting layer 152 is larger, the thickness of the first bending area A is smaller than the thickness of the second bending area B, and there are different thickness of the first neutral layer adjusting layer 151 and the second neutral layer adjusting layer 152, so that the positions of the neutral layer 18 in the first bending area A and the second bending area B are adjusted; and alike both the thin film transistor layer 12 and the encapsulation layer 14 are located in the areas where they are pressed so that the service lifetime and the reliability of the flexible display panel 1 can be improved because the thin film transistor layer 12 and the encapsulation layer 14 can be pressed but can not be pulled.

Optionally in the flexible display panel according to the embodiment of the invention, the first neutral layer adjusting layer is arranged at the same layer as the second neutral layer adjusting layer.

As illustrated in FIG. 5 and FIG. 6, the neutral layer adjusting layer 15 is a back film formed on the side of the flexible substrate 11 away from the light-emitting layer 13.

Since the neutral layer adjusting layer 15 includes the first neutral layer adjusting layer 151 and the second neutral layer adjusting layer 152 corresponding respectively to the different bending areas, the flexible display panel 1 can be configured with the neutral layer adjusting layer 15 according to a bending condition so that the thin film transistor layer 12 and the encapsulation layer 14 remain pressed while the flexible display panel is being bent, to thereby improve the service lifetime of the flexible display panel 1.

Further to the respective embodiments above, the flexible substrate 1 can be made of Polyimide (PI) or Polyethylene terephthalate, and the neutral layer adjusting layer 15 can be made of Polydimethylsiloxane.

An embodiment of this disclosure further provides a display device including the flexible display panel 1 according to any one of the embodiments above of this disclosure.

Furthermore an embodiment of this disclosure further provides a method for fabricating the flexible display panel 1 according to any one of the embodiments above of this disclosure, where the method includes:

fabricating the flexible display panel 1, where the flexible display panel 1 includes the flexible substrate 11, and the thin film transistor layer 12, the light-emitting layer 13, the encapsulation layer 14, the polarizing sheet layer 16, and the protecting layer 17 formed on the flexible substrate 11 successively as illustrated in FIG. 3;

forming the neutral layer adjusting layer in the bending area of the flexible display panel;

when the flexible display panel 1 includes the first bending area A, forming the neutral layer adjusting layer 15 at a corresponding position to the first bending area A, on the flexible display panel 1, where the neutral layer adjusting layer 15 is configured to adjust the position of the neutral layer in the first bending area A to the encapsulation layer 14;

hen the flexible display panel 1 includes the second bending area B, forming the neutral layer adjusting layer 15 at a corresponding position to the second bending area B A, on the flexible display panel 1, where the neutral layer adjusting layer 15 is configured to adjust the position of the neutral layer in the second bending area B to the thin film transistor layer 12.

Optionally in the method for fabricating the flexible display panel according to the embodiment of this disclosure, as illustrated in FIG. 5 and FIG. 6, when the flexible display panel includes the first bending area A and the second bending area B, the method includes:

forming the first neutral layer adjusting layer 151 at a corresponding position to the first bending area A, on the flexible display panel; and forming the second neutral layer adjusting layer 152 at a corresponding position to the second bending area B, on the flexible display panel.

Optionally in the method for fabricating the flexible display panel according to the embodiment of this disclosure, the first neutral layer adjusting layer and the second neutral layer adjusting layer are formed at the same layer.

Optionally in the method for fabricating the flexible display panel according to the embodiment of this disclosure, as illustrated in FIG. 5, forming the neutral layer adjusting layer 15 in the bending area of the flexible display panel 1 optionally includes:

fitting the back film on the surface of the flexible substrate 11 of the flexible display panel 1 on the side thereof away from the light-emitting layer 13 as illustrated in FIG. 3; and optically curing the back film using a mask to change a Young's modulus of the back film so that the position of the neutral layer 18 of the flexible display panel 1, at the corresponding position to the second bending area B is adjusted to the thin film transistor layer 12, and the position of the neutral layer 18 of the flexible display panel 1, at the corresponding position to the first bending area A is adjusted to the encapsulation layer 14.

Although the back film can be optically cured to thereby change the Young's modulus thereof, the back film can be processed in any other applicable process to change the Young's modulus thereof without departing from the scope of this disclosure.

Optionally the back film can be optically cured using the mask by optically curing the back film through ultraviolet irradiation or in another process to thereby change the Young's modulus thereof so that the first Young's modulus of the first neutral layer adjusting layer 151 is smaller than the second Young's modulus of the second neutral layer adjusting layer 152. The Young's modulus of the back film can be changed to thereby adjust the position of the neutral layer 18 of the flexible display panel 1 so that the thin film transistor layer 12 and the encapsulation layer 14 can remain at the position of the neutral layer 18 of the flexible display panel 1, and thus remain pressed, while the flexible display panel is being bent.

Optionally in the method for fabricating the flexible display panel according to the embodiment of this disclosure, as illustrated in FIG. 6, forming the neutral layer adjusting layer 15 in the bending area of the flexible display panel 1 optionally includes:

fitting the back film on the surface of the flexible substrate 11 of the flexible display panel 1 on the side thereof away from the light-emitting layer 13; and cutting the back film to thereby adjust the thickness thereof so that the position of the neutral layer 18 of the flexible display panel 1, corresponding to the position of the second bending area B is adjusted to the thin film transistor 12, and the position of the neutral layer 18 of the flexible display panel 1, corresponding to the position of the first bending area A is adjusted to the encapsulation layer 14.

The back film can be cut to thereby adjust the thickness thereof so that the first thickness h1 of the first neutral layer adjusting layer 151 is smaller than the second thickness h2 of the second neutral layer adjusting layer 152. The thickness of the back film can be changed to thereby adjust the position of the neutral layer 18 of the flexible display panel 1 so that the thin film transistor layer 12 and the encapsulation layer 14 can remain at the position of the neutral layer 18 of the flexible display panel 1, and thus remain pressed, while the flexible display panel is being bent.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A flexible display panel, comprising: a flexible substrate, and a thin film transistor layer, a light-emitting layer, and an encapsulation layer located on one side of the flexible substrate successively, wherein:

the flexible display panel comprises a bending area in which a neutral layer adjusting layer is located on the side of the flexible substrate away from the light-emitting layer;

when the bending area is a first bending area, the neutral layer adjusting layer is configured to adjust a position of a neutral layer in the first bending area to the encapsulation layer; and when the bending area is a second bending area, the neutral layer adjusting layer is configured to adjust the position of the neutral layer in the second bending area to the thin film transistor layer;

wherein the first bending area is an area where the flexible substrate is bent away from the light-emitting layer, and the second bending area is an area where the flexible substrate is bent toward the light-emitting layer.

2. The flexible display panel according to claim 1, wherein the flexible display panel comprises the first bending area and the second bending area; and the neutral layer adjusting layer corresponding to the first bending area is a first neutral layer adjusting layer, and the neutral layer adjusting layer corresponding to the second bending area is a second neutral layer adjusting layer.

3. The flexible display panel according to claim 2, wherein a first Young's modulus of the first neutral layer adjusting layer is smaller than a second Young's modulus of the second neutral layer adjusting layer.

4. The flexible display panel according to claim 2, wherein a first thickness of the first neutral layer adjusting layer is smaller than a second thickness of the second neutral layer adjusting layer.

5. The flexible display panel according to claim 2, wherein the first neutral layer adjusting layer and the second neutral layer adjusting layer are arranged at a same layer.

6. The flexible display panel according to claim 1, wherein the neutral layer adjusting layer is a back film formed on the side of the flexible substrate away from the light-emitting layer.

7. The flexible display panel according to claim 1, wherein the material of the flexible substrate comprises Polyimide; and the material of the neutral layer adjusting layer comprises Polydimethylsiloxane.

8. A display device, comprising the flexible display panel according to claim 1.

9. A method for fabricating the flexible display panel according to claim 1, the method comprising:

fabricating the flexible display panel; and forming the neutral layer adjusting layer in the bending area of the flexible display panel.

10. The method according to claim 9, wherein when the flexible display panel comprises the first bending area and the second bending area, the method comprises:
- forming the first neutral layer adjusting layer at a corresponding position to the first bending area, on the flexible display panel; and
- forming the second neutral layer adjusting layer at a corresponding position to the second bending area, on the flexible display panel.

11. The method according to claim 10, wherein the first neutral layer adjusting layer and the second neutral layer adjusting layer are formed at a same layer.

12. The method according to claim 11, wherein forming the neutral layer adjusting layer in the bending area of the flexible display panel comprises:
- fitting a back film on the surface of the flexible substrate of the flexible display panel on the side thereof away from the light-emitting layer; and
- optically curing the back film using a mask to change a Young's modulus of the back film so that the position of the neutral layer of the flexible display panel, at the corresponding position to the second bending area is adjusted to the thin film transistor layer, and the position of the neutral layer of the flexible display panel, at the corresponding position to the first bending area is adjusted to the encapsulation layer.

13. The method according to claim 12, wherein the back film is optically cured using the mask by optically curing the back film through ultraviolet irradiation.

14. The method according to claim 11, wherein forming the neutral layer adjusting layer in the bending area of the flexible display panel comprises:
- fitting a back film on the surface of the flexible substrate of the flexible display panel on the side thereof away from the light-emitting layer; and
- cutting the back film to thereby adjust the thickness thereof so that the position of the neutral layer of the flexible display panel, at the corresponding position to the second bending area is adjusted to the thin film transistor, and the position of the neutral layer of the flexible display panel, at the corresponding position to the first bending area is adjusted to the encapsulation layer.

* * * * *